(12) United States Patent
Short et al.

(10) Patent No.: US 11,614,465 B2
(45) Date of Patent: Mar. 28, 2023

(54) CONFIGURABLE TEST INSTRUMENT FOR POWER EQUIPMENT

(71) Applicant: Doble Engineering Company, Marlborough, MA (US)

(72) Inventors: Scott Lee Short, Marlborough, MA (US); Narendra Nagaraj, Marlborough, MA (US); Fernando D. Gonzalez Tristan, Watertown, MA (US); Kevin M. Sullivan, Waltham, MA (US); Christopher R. Hamilton, Arlington, MA (US)

(73) Assignee: DOBLE ENGINEERING COMPANY, Marlborough, MA (US)

( * ) Notice: Subject to any disclaimer, the term of this patent is extended or adjusted under 35 U.S.C. 154(b) by 12 days.

(21) Appl. No.: 17/222,559

(22) Filed: Apr. 5, 2021

(65) Prior Publication Data

US 2022/0317150 A1    Oct. 6, 2022

(51) Int. Cl.
*G01R 1/04* (2006.01)
*G01R 1/067* (2006.01)
(Continued)

(52) U.S. Cl.
CPC .......... *G01R 1/0441* (2013.01); *G01R 1/025* (2013.01); *G01R 31/2827* (2013.01)

(58) Field of Classification Search
CPC ........ G01R 1/04; G01R 1/0441; G01R 1/025; G01R 1/067; G01R 1/073; G01R 31/28; G01R 31/2827
See application file for complete search history.

(56) References Cited

U.S. PATENT DOCUMENTS

| 6,385,739 | B1 * | 5/2002 | Barton | ................ G06F 11/2268 714/E11.166 |
|---|---|---|---|---|
| 2009/0248358 | A1 | 10/2009 | Safa | |
| 2013/0320959 | A1 | 12/2013 | Mikata et al. | |

FOREIGN PATENT DOCUMENTS

| CN | 21241281 | 1/2021 |
|---|---|---|
| DE | 202013000118 U1 | 2/2013 |

OTHER PUBLICATIONS

European Search Report and Written Opinion, dated Sep. 5, 2022, pp. 1-8, issued in European Application No. EP 22 16 5706, European Patent Office, Munich, Germany.
(Continued)

*Primary Examiner* — Neel D Shah
(74) *Attorney, Agent, or Firm* — Crowell & Moring LLP

(57) ABSTRACT

A diagnostic test instrument for testing power system equipment may include a chassis having a number of bays capable of receiving test circuitry modules, which may be field inserted by a user desiring to perform a particular test. The instrument may include controller circuitry that may sense in each of the bays whether a respective test circuitry module is inserted therein, and then interrogate respective test circuitry modules in each respective bay to identify a type of the respective test circuitry module. Available testing capabilities may be identified according to the type of each of the respective test circuitry modules identified in respective bays. The controller circuitry may output configuration instructions to test circuitry modules, and respective test ports included in each of the respective test circuitry modules may be selectively illuminated as a configuration instruction to visually identify an assigned functionality of the respective test ports.

20 Claims, 10 Drawing Sheets

(51) Int. Cl.
  *G01R 1/073* (2006.01)
  *G01R 31/28* (2006.01)
  *G01R 1/02* (2006.01)

(56) References Cited

OTHER PUBLICATIONS

Product Flyer, PXI Express Chassis, Dated Dec. 10, 2019, pp. 1-16, National Instruments, available at URL https://www.ni.com/pdf/product-flyers/pxi-express•chassis.pdf.

\* cited by examiner

CONFIGURABLE TEST INSTRUMENT FOR POWER EQUIPMENT

TECHNICAL FIELD

This disclosure relates to power equipment testing and more particularly to a configurable test instrument for power equipment.

BACKGROUND

Power equipment, such as transformers, circuit breakers, bushings, relays and the like are used in electric power generation and transmission within a power system. Such power systems may include a power grid having power equipment such as transformers, substations, relays and the like to control and manage electricity within the power grid. Startup, testing and maintenance of such power equipment may be performed by a power system technician using test equipment. Such test equipment may be capable of generating input voltages and input currents for application to a piece of power equipment under test, and also capable of monitoring operational parameters responsive to the inputs, such as outputs and indications of the power equipment function during the test. As part of the testing, voltage and current simulation may be applied to the piece of power equipment to evaluate health, performance, and operational functionality of the equipment.

DETAILED DESCRIPTION

Figure 1:
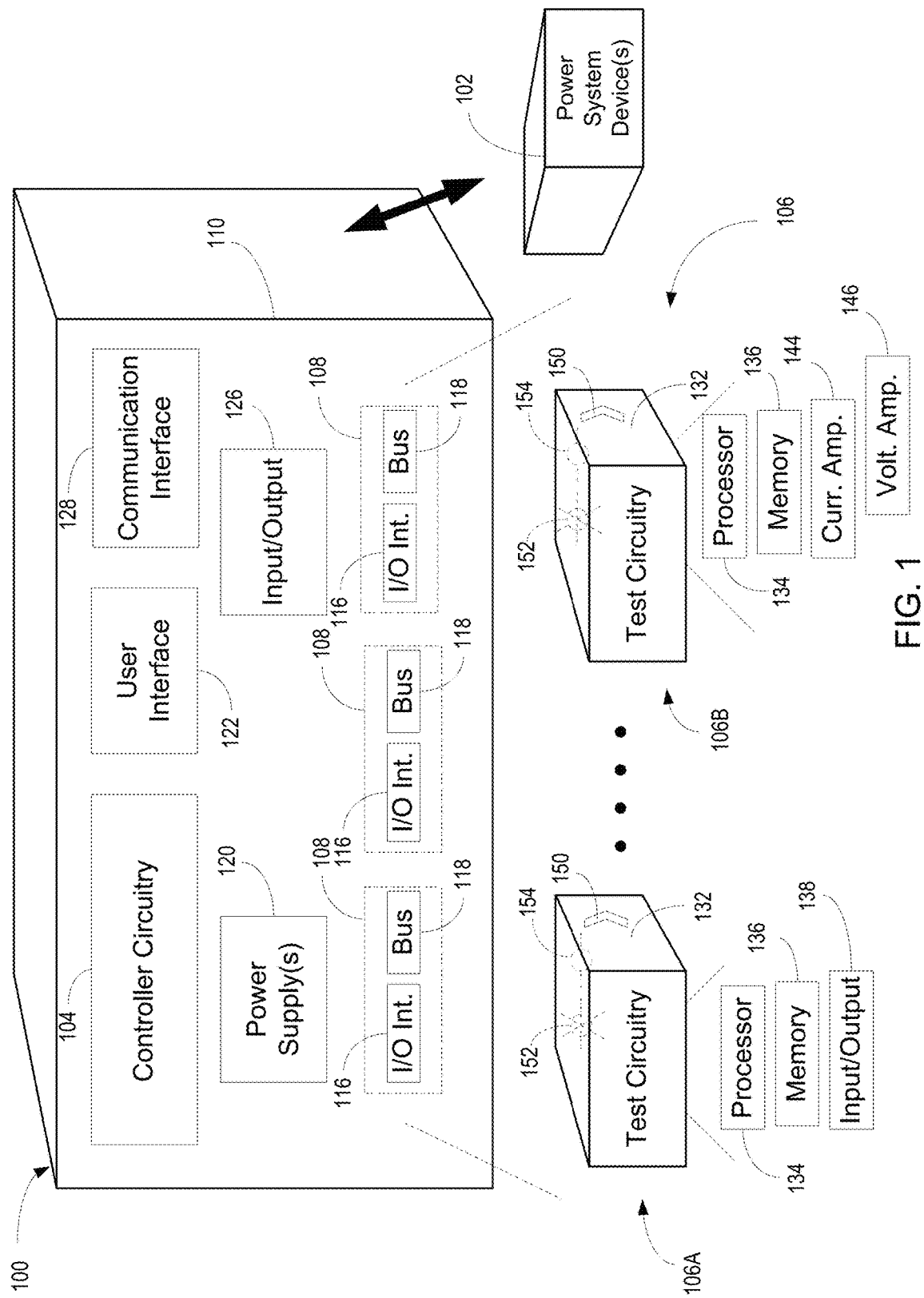
FIG. 1 is a block diagram example of a diagnostic test system and a power system device(s).

The discussion herein makes reference to a diagnostic test system, which may be a diagnostic test instrument that includes a controller circuitry, a power supply, a chassis comprising a plurality of bays, and a plurality of test circuitry modules. Each of the test circuitry modules are configured to be interchangeably received in any one of the plurality of bays. Each of the bays includes an input/output (I/O) interface to the controller circuitry and a bus providing an electrical interface with the power supply. The controller circuitry is configured to interrogate the test circuitry modules present in the bays and graphically present the identified test circuitry modules in a user interface according to a respective bay location.

An interesting feature of the diagnostic test system relates to the LED light rings included in at least some of the interchangeable test circuitry modules. Once the test circuitry modules are interrogated by the controller circuitry and identified, the LED light rings may be selectively illuminated with one or more different colors as a instructional guide to a user for making connections of the diagnostic test system to a power system device to be tested.

Another interesting feature of the diagnostic test system relates to use of the LED light rings for alarming and for operational indications while the controller circuitry is completing a test protocol to test a power system device.

Yet another interesting feature of the diagnostic test system relates to a microprocessor in the diagnostic test system being configured to dynamically drive the LED light rings in respective test circuitry modules to illuminate with different colors, patterns, and frequency to visualize to the user status of the system; operation of the system; and setup of a test protocol or test routine within the system. Specific example scenarios of the processor selectively illuminating the LED light rings enables:

Visualization of asserted input and outputs of test ports in the test circuitry modules.
Capability to manually control LED visualizations inside a test or free form outside a test.
Capability to programmatically control LED behavior inside a test or free form outside a test through different visualizations.
Visualization of the assigned function of terminals or test ports in the test circuitry modules.
Visualization of a faulted amplifier and its faulted condition.
Capability to guide users through different visualizations.
Visualization of phase of electrical inputs and outputs.
Visualization of intensity, such as current or voltage or signal level, of all inputs and outputs.
Communicate power-on self-test (POST) and diagnostic detail of the system through different visualizations.
Visualization of one or more sensed conditions and their value and/or state.
Visualization of a replay of a pre-recorded sequence of events to indicate which terminals of test ports were behaving in what manner.
Visualization of open current detection as well as other faults.
Visualization of channel modulation.
Visualization of safety of the unit including ground conditions.
Visualization of power quality and its parameters.
Visualization of a clustered configuration including remote node configuration.
Visualization of update and upgrade conditions and behavior of the system.
Capability to switch to a color blind compatible visualization.
Capability to switch between extreme low light conditions and extreme bright light conditions.
Visualization of capture status of inputs.
Visualization of end-to-end remote phase configuration.

FIG. 1 is a block diagram of an example of a diagnostic test system 100 and a power system device(s) 102. The system 100 may provide diagnostic testing for electric power system devices 102 such as relays, transformers, breakers, bushings, tap changers and any other equipment within an electric power system. The diagnostic testing performed by the system 100 may include viability/assessment testing such as relay scheme verification, dielectric evaluation, integrity and functionality testing, and other installation, maintenance and modification testing. In addition or alternatively, the system 100 may perform monitoring/detection functions, such as partial discharge (PD) detection, dissolved gas analysis (DGA), and other forms of power equipment verification and analysis. The system may be used for in-service testing and/or offline/out of service testing and assessment. The system 100 may be a portable system providing on site diagnostic testing useful for setup, functionality, maintenance.

The diagnostic test system 100 provides a field re-configurable platform that allows a user technician flexibility to perform any of a variety of different diagnostic tests using the same test instrument. Functionality of the field reconfiguration of the diagnostic test system 100 is provided at least in part by controller circuitry 104 and test circuitry modules 106.

The controller circuitry 104 is the central control and communication center for the diagnostic test system 100 instrument platform. The controller circuitry 104 manages and controls the functionality of system in identifying available diagnostic tests, configuration of the hardware and software/firmware in the system 100 to perform a user selected diagnostic test, and execution of a test protocol to complete the selected test. The controller circuitry 104 also manages and controls wired and wireless communication capabilities, such as Ethernet, USB, Wi-Fi, BLUETOOTH used for connectivity and control of the instrument. The controller circuitry 104 may include different digital testing formats such as IEC 61850 testing, which are generated and controlled by the controller circuitry 104. In addition, the controller circuitry 104 may support testing standards, such as the latest standards for Sampled Values, and messaging protocols, such as GOOSE messaging protocol. Additionally, the controller circuitry 104 may provide interface connectivity for real time testing simulators, such as those used in power system labs as power amplifiers.

The test circuitry modules 106 may be configured to provide for example, digital and/or analog input/output capabilities, power sources, and other functionality to provide simulation of electric power system and related system conditions for a power device under test. Example testing supported by the test circuitry modules 106 include metering testing, testing and calibration of protection and control relays, simulation of power system phenomena, verification of voltage, current, phase and power transducers, IEC 61850 testing, traveling wave protection testing, distribution recloser testing, distance relay testing, out-of-step blocking testing, simulation state dynamic testing, functional element testing, which may include automatic stepped, smooth, pulsed ramp and rate-of-change control of frequency, current, voltage, and phase angle and the like. Test protocols executed with the controller circuitry 104 may initiate any number of different diagnostic tests for a particular power system device as part of a test protocol. For example, with regard to protection and control relay testing, the controller circuitry 104 may manage and control testing of impedance, differential, current, voltage, directional, frequency, volts-per-hertz, rate-of-change of frequency, sync-check, reclosing and other functionality present in the particular power system device under test.

Each of the test circuitry modules 106 may be interchangeably received in any of a plurality of different bays 108 included in a chassis 110 of the diagnostic system 100. Each of the bays 108 may include an input/output interface 116 in communication with the controller circuitry 102, and a bus 118 providing an electrical interface with a power supply 120 included in the system 100. In an example, the power supply 120 may be, for example, a DC power supply that may power the diagnostic system 100 and provide power source outputs to power system devices 102.

The bays 108 may be sized to receive any of a number of different test circuitry modules 106, which may be inserted into any one of the bays 108 in the field to configure the diagnostic test system 100 according to a desired testing configuration. Although three bays 108 are illustrated in FIG. 1, fewer or greater numbers of bays may be included in the chassis 110 according to the number of test circuitry modules 106 that are needed in the chassis 110 to accomplish the desired diagnostic testing.

Interchangeability of different types of test circuitry modules 106 in the chassis 110 provides a user of the diagnostic system with the capability of dynamic field re-configuration of the diagnostic system 100 simply by swapping out the test circuitry modules 106 in the different bays 108. The controller circuitry 104 may interrogate the test circuitry modules 106 present in the bays 108 and graphically present the identified test circuitry modules 106 in a user interface 122 included in the chassis of the diagnostic system 100. The identified test circuitry modules 106 may be presented in the user interface according to a respective bay locations in the chassis 110 where the identified test circuitry modules 106 are inserted.

The diagnostic system 100 may communicate with the test circuitry modules 106 and/or the power system device 102 via input/output (I/O) circuitry 126. In addition or alternatively, the diagnostic system 100 may communicate with the power system device(s) 102 via a communication interface 126, which may also be used to communicate with other devices and/or networks.

Each of the test circuitry modules 106 may be a separate and independent housing 132 containing a test circuitry 134 and a test memory 136. In examples, the housing 132 of a test controller circuitry 134 may also include test specific circuitry according to the type of test controller circuitry 134 being provided. For example, a logic I/O test controller circuitry 106A may be a logic I/O type having test I/O circuitry 138, whereas a power source test circuitry 106B may be a power source type having power source test circuitry that includes a current amplifier 144 and/or a voltage amplifier 146. The controller circuitry 104 may control the test circuitry modules 106 to independently and selectively supply at least one of voltage and current in a predetermined phase according to a bay location of the respective test circuitry modules 106 and a test protocol being executed by the controller circuitry 104.

Other examples of test circuitry modules include high density logic I/O modules, LVA Current and Voltage modules.

Mounted on, or extending from the housing 132 of each of the test circuitry modules 106 may be a mounting bracket 150, an I/O connector 152 and an electrical connector 154. The mounting bracket 150 may engage with the chassis 110 in such a way that the respective test circuitry module 106 is slid into and fixedly held in a respective one of the bays 108. For example, mounting bracket 150 may mechanical hardware such as slides, ears, fingers, a carriage or other mechanical structure that slideably couples the housing 110 of a respective test circuitry module 106 to the chassis 110. A locking mechanism such as a manually operated latch, or keeper may be included on the housing 132 such that the test circuitry module 106 is fixedly and rigidly maintained in the bay 108.

The I/O connector 152 may be any form of connector that creates a signal communication path with the I/O interface 116 in the bay 108 when the test circuitry module 106 is inserted into the bay 108. For example, the I/O connector 152 may include alignment pins to align and engage the I/O connector 152 with the I/O interface 116. The electrical connector 154 may be any form of connector that creates a power path for the flow of voltage and current from the bus 118 to the electrical connector 154 when the test circuitry module 106 is slid into a respective bay 108. For example, the electrical connector 154 may include stays that engage with the bus 118 in the respective bay 108.

Figure 2:
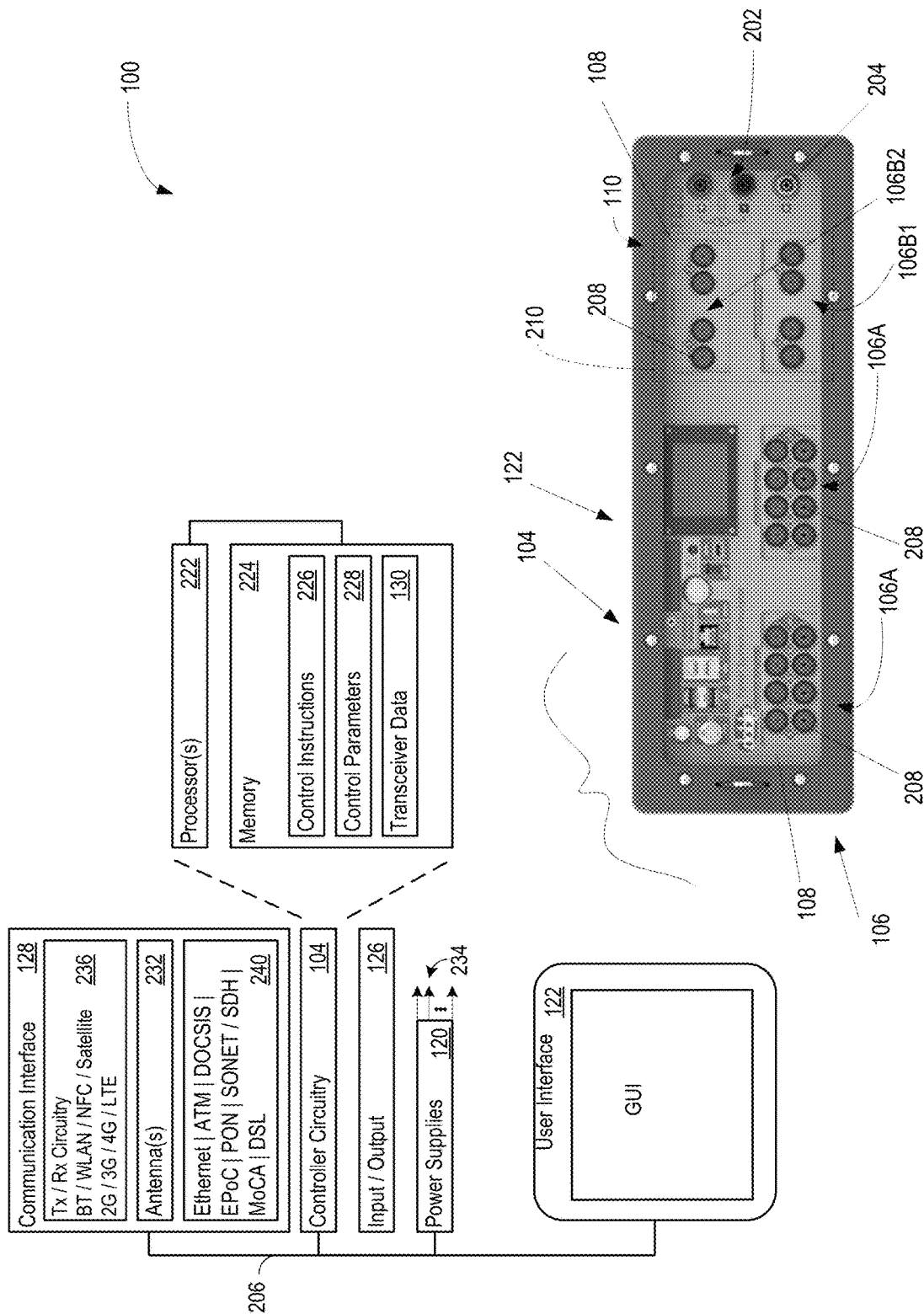
FIG. 2 is a block diagram of another example of the diagnostic test system.

FIG. 2 is a block diagram of another example of the diagnostic test system 100. In the example of FIG. 2, the diagnostic test system 100 includes four bays 108 in the chassis 110, with a respective test circuitry module 106 inserted in each of the bays 108. The diagnostic test system 100 illustrated in FIG. 2 also includes the controller circuitry 104, the user interface 122, battery simulator test ports 202 and a ground test port 204. The battery simulator test ports 202 may be configured to receive connectors, such as banana plug connectors, in a positive port and a negative port to provide DC voltage from the power supply(s) 120. The ground test port 204 may also be configured to receive a connector, such as a banana plug connector in order to provide a ground reference. The ground test port 204 and the battery simulator test ports 202 may be coupled with a power system device(s) 102 (FIG. 1) under test by test lead cables that are electrically coupled with the power system device 102 at predetermined locations.

The controller circuitry 104 of this example may include the user interface 122, I/O interface 126 and the communication interface 128 in communication via a communication path 206. The controller circuitry 104 may include any combination of hardware, software, firmware, or other circuitry. The controller circuitry 104 may be implemented, for example, with one or more systems on a chip (SoC), application specific integrated circuits (ASIC), discrete analog and digital circuits, and other circuitry. The controller circuitry 104 is part of the implementation of any desired functionality in the diagnostic test system 100. In that regard, the controller circuitry 104 may include logic that facilitates, as examples, test protocols; running applications; accepting user inputs; saving and retrieving application data; establishing, maintaining, and terminating data connections for, as one example, power system device connectivity; establishing, maintaining, and terminating wireless network connections, BLUETOOTH connections, or other connections; and displaying relevant information on the user interface 122.

The user interface 122 and the input/output (I/O) interfaces 126 may include a graphical user interface, touch sensitive display, voice or facial recognition inputs, buttons, switches, speakers and other user interface elements. Additional examples of the I/O interfaces 120 include microphones, temperature sensors, headset and microphone input/output jacks, universal serial bus (USB), serial advanced technology attachment (SATA), and peripheral component interconnect express (PCIe) interfaces and connectors, memory card slots, and other types of inputs. The I/O interfaces 120 may further include audio outputs, magnetic or optical media interfaces (e.g., a CDROM or DVD drive) or other types of serial, parallel, or network data interfaces.

The controller circuitry 104 may include one or more processors 222 and memories 224. The memory 224 stores, for example, control instructions 226 that the processor 222 executes to carry out desired functionality for the diagnostic test system 100. The control parameters 228 provide and specify configuration and operating options for the control instructions 226. For instance, the control instructions 226 and control parameters 228 may implement diagnostic testing using a test protocol. The memory 224 may also store available testing capabilities 230 of the diagnostic test system 100. Each of the stored available testing capabilities may include software and firmware to configure the control instructions 226 and control parameters 228 of the controller circuitry 104 and also the test circuitry modules 106 to perform a predetermined test protocol.

The communication interface 128 may include wireless transceiver circuitry 236, e.g., radio frequency (RF) transmit (Tx) and receive (Rx) circuitry, performing transmission and reception of signals through one or more antennas 232. Accordingly, the wireless transceiver circuitry 236 may include modulation/demodulation circuitry, digital to analog converters (DACs), analog to digital converters (ADCs), filters, pre-amplifiers, power amplifiers and/or other logic for transmitting and receiving through one or more of the antennas 232.

The communication interfaces 114 may also include physical medium transceiver circuitry 240. Examples of physical media include optical fiber, coaxial cable such as RG6, telephone lines, network (e.g., Ethernet) cables, buses such as the PCIe bus, and serial and parallel cables. Accordingly, the physical medium transceiver circuitry 240 may include Tx and Rx circuits for communication according to, as examples, Ethernet, asynchronous transfer mode (ATM), over associated physical media. As such, the signals transmitted and received by the communication interface 114 may adhere to any of a diverse array of formats, protocols, modulations frequency channels, bit rates, and encodings.

The power supply 120 included in the diagnostic test system 100 may be a DC power supply providing multiple different voltages 234 to supply the controller circuitry 104, the communication interface 128, the input/output interface 126, and the test circuitry modules 106.

In an example diagnostic testing scenario, the diagnostic test system 100 may be user configured as a protection testing power simulator by inserting logic type test circuitry modules 106 and power source type test circuitry modules 106 in the bays 108. The logic type test circuitry modules 106 include logic I/O test circuitry 106A, and the power source type test circuitry modules 106B include power source test circuitry in the form of a current source test circuitry module 106B1 having a current amplifier and a voltage source test circuitry 106B2 having a voltage amplifier. Each of the test circuitry modules 106 include test ports 208 capable of receiving test leads to electrically couple the diagnostic tests system 100 to power system device(s) 102. The test ports 208 may be any form of mechanically detachable connector forming an electrical connection. In the illustrated example, the test ports are plug connectors cable of receiving plugs, such as 2 mm or 4 mm banana plugs.

Figure 3:
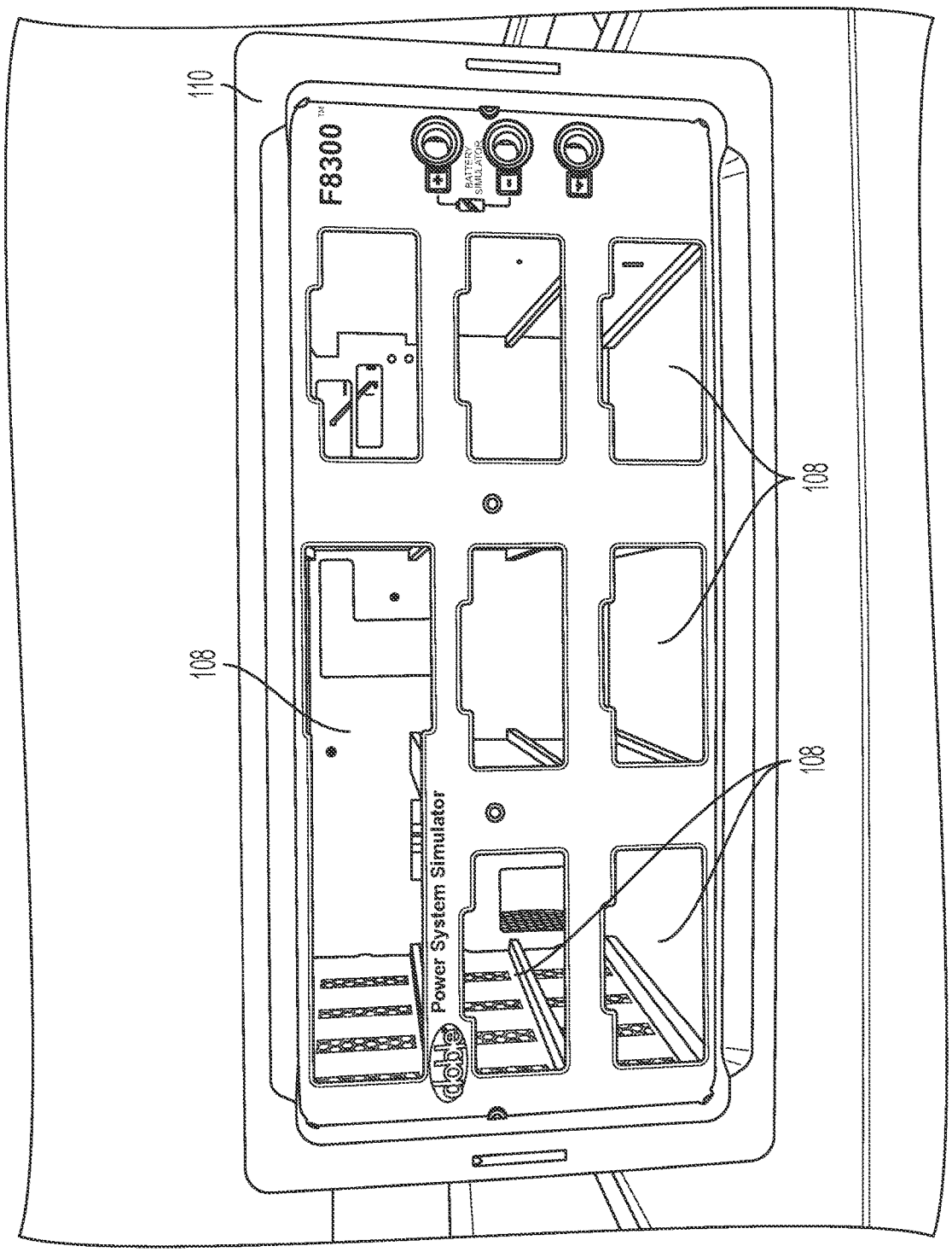
FIG. 3 is an example of a chassis for use with the diagnostic test system.

In other examples, such as in the example of FIG. 3, the chassis 110 may include additional bays 108 capable of receiving the test circuitry modules 106. In addition, as illustrated in the example of FIG. 3, the controller circuitry 104 and the user interface 122 may be removeably inserted in a bay 108. Accordingly, in some examples, controller circuitry 104 and/or user interfaces 122 having different functionality/capability may be interchanged by a user to achieve a desired diagnostic test capability. For example, controller circuitry 104 having different I/O and/or memory storage capability may be interchanged according to the requirements of particular diagnostic testing. In another example, the user interface may be interchanged between a high resolution display screen and a touch screen according to the needs of the user to perform diagnostic testing. As illustrated in FIGS. 2 and 3, the configurations of the test circuitry modules 106 may also be varied by the user depending on the frame size of the chassis 110 chosen by the end user to accommodate the diverse needs of the user's testing requirements.

Figure 4:
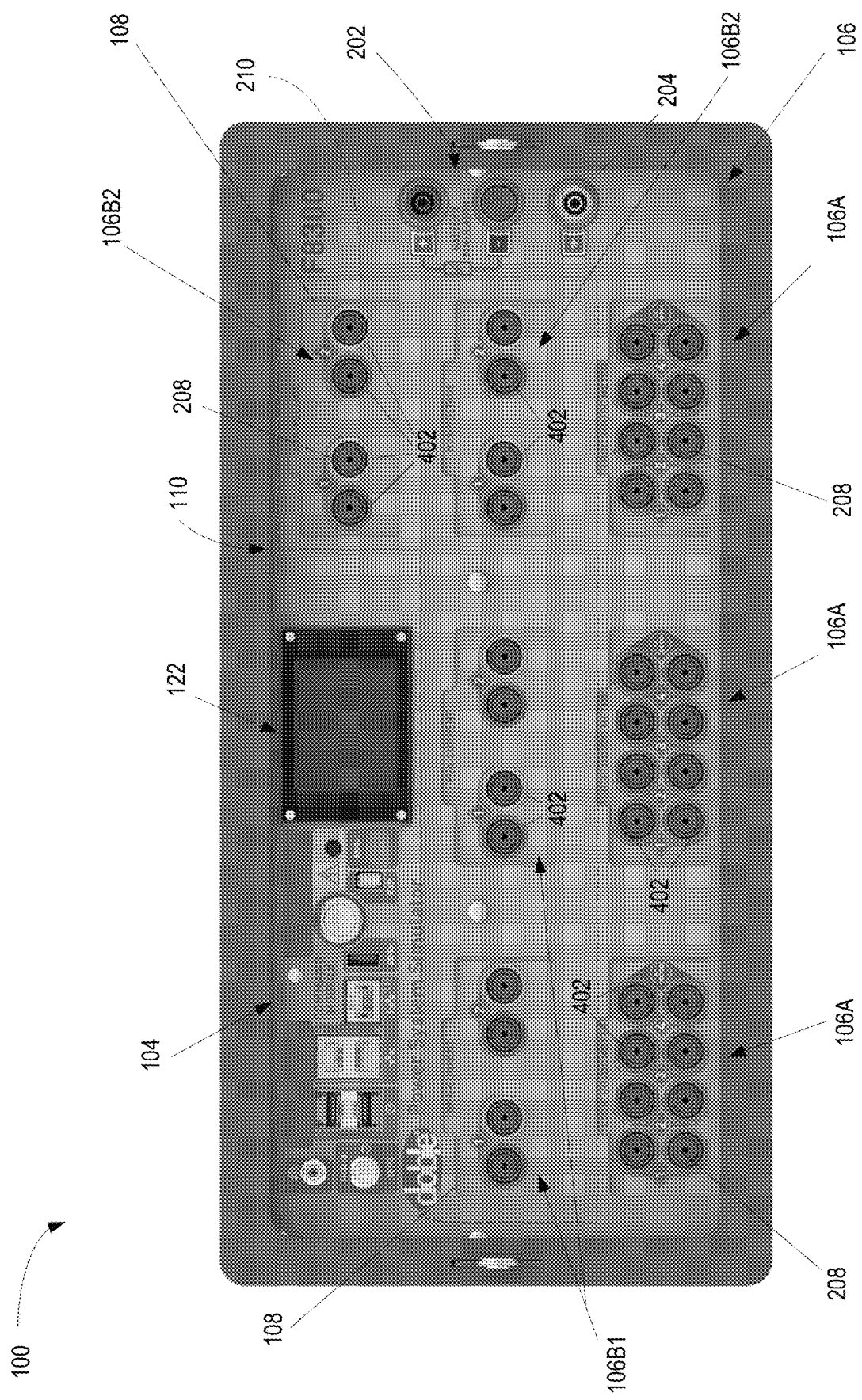
FIG. 4 is another example of the diagnostic test system.

FIG. 4 is another example of the diagnostic test system 100. The diagnostic system 100 of FIG. 4 includes the controller circuity 104, and test circuitry modules 106 inserted in bays 108 in the chassis 110. In this example, three test circuitry modules 106B1 and 106B2 of the power source type, and three test circuitry modules 106A of the logic I/O type are illustrated. In other examples, any other configuration of test circuitry modules 106 may be used.

Example user selected configurations of the test circuitry modules 106 are shown in the following tables were logic I/O test circuitry modules 106A, current source test circuitry modules 106B1, voltage source test circuitry modules 106B2, controller circuitry 104 and user interface 122 are illustrated in the bays of the diagnostic test system 100 illustrated in FIG. 2.

TABLE 1

Configuration 1 - Controller Circuitry, User Interface, Two Simulation Voltage Sources, Four Simulation Current Sources, and our I/O

| Controller circuitry 104 and user interface 122 SV & GOOSE | Logic I/O 4 I/O | |
|---|---|---|
| Voltage source test circuitry module 106B2 2 X V | Current source test circuitry module 106B1 2 X I | Current source test circuitry module 106B1 2 X I |

TABLE 2

Configuration 2 - Controller Circuitry, User Interface, Four Simulation Voltage Sources, Two Simulation Current Sources, and four I/O

| Controller circuitry 104 and user interface 122 SV & GOOSE | Logic I/O test circuitry module 106A 4 I/O | |
|---|---|---|
| Voltage source test circuitry module 106B2 2 X V | Voltage source test circuitry module 106B2 2 X V | Current source test circuitry module 106B1 2 X I |

TABLE 3

Configuration 3 - Controller Circuitry, User Interface, Six Simulation Current Sources, and four I/O

| Controller circuitry 104 and user interface 122 SV & GOOSE | Logic I/O test circuitry module 106A 4 I/O | |
|---|---|---|
| Current source test circuitry module 106B1 2 X I | Current source test circuitry module 106B1 2 X I | Current source test circuitry module 106B1 2 X I |

TABLE 4

Testing Options

| Controller circuitry 104 and user interface 122 - SV (F8870-IEC61850-92LE, IEC61869-9, GOOSE (F8860-IEC 61850-7), Time Synch - (F8885-PTP, GPS) | Logic I/O test circuitry modules 106A | |
|---|---|---|
| Voltage source test circuitry module 106B2 | Voltage source test circuitry module 106B2 | Current source test circuitry module 106B1 |

In another example, user selected configurations of the test circuitry modules 106 in the described example diagnostic tests are shown in the following tables where logic I/O test circuitry modules 106A, current source test circuitry modules 106B1, voltage source test circuitry modules 106B2, controller circuitry 104 and user interface 122 are illustrated in the bays of the diagnostic test system 100 illustrated in FIG. 4.

TABLE 5

Microprocessor - Transmission/Distribution Configuration

| Controller circuitry 104 and user interface 122 - SV (IEC61850-92LE, IEC61869-9), GOOSE (IEC 61850-7), Time Synch - PTP, GPS | Logic I/O test circuitry module 106A, Metering Transducer | Batt Sim |
|---|---|---|
| Voltage source test circuitry module 106B2 -2 Voltages | Voltage source test circuitry module 106B2 - V-2 Voltages | Logic I/O-Input or Output module 106A, Metering Transducer |
| Current source test circuitry module 106B1 -I-2 Current | Current source test circuitry module 106B1 -I-2 Current | Current source test circuitry module 106B1 -I-2 Current |

TABLE 6

Generator - Electromechanical/Processor - Relay Protection

| Controller circuitry 104 and user interface 122 - SV (IEC61850-92LE, IEC61869-9), GOOSE (IEC 61850-7), Time Synch - PTP, GPS | Logic I/O-Input or Output, Metering Transducer | Batt Sim |
|---|---|---|
| Voltage source test circuitry module 106B1 -2 Voltages - V-2 Voltages | Voltage source test circuitry module 106B2 -2 Voltages - V-2 Voltages | Current source test circuitry module 106B1 I-2 Current |
| Voltage source test circuitry module 106B2 -2 Voltages | Voltage source test circuitry module 106B2 -2 Voltages - V-2 Voltages | Current source test circuitry module 106B1 I-2 Current |

TABLE 7

Electromechanical/Microprocessor - Transmission Distribution

| Controller circuitry 104 and user interface 122 - SV (IEC61850-92LE, IEC61869-9), GOOSE (IEC 61850-7), Time Synch - PTP, GPS | Logic I/O test circuitry module 106A, Metering Transducer | Batt Sim |
|---|---|---|
| Current source test circuitry module 106B1 -I -2 Current | Current source test circuitry module 106B1 -I -2 Current | Current source test circuitry module 106B1 A-I-2 Current |
| Voltage source test circuitry module 106B2 -V-2 Voltages | Voltage source test circuitry module 106B2 -V-2 Voltages | Voltage source test circuitry module 106B2 --V-2 Voltages |

Referring to FIGS. 2 and 4, in example configurations, the diagnostic test system 100 may be configured as diagnostic test system for protective relays, such as electromechanical, electronic, or fully digital microprocessor based protective relays by the user inserting logic I/O test circuitry module(s) 106A, and power source test circuitry modules 106B in the form of a current source test circuitry module 106B1 and a voltage source test circuitry module 106B2 into the bays 108. The location in the bays 108 of the test circuitry modules 106 is user configurable such that different test circuitry modules 106 may be inserted in any respective bay 108 according to the desires/convenience of the user. The type of the test circuitry modules 106 inserted, however, dictates the available testing capabilities of the diagnostic test system 100. For example, with a single current source test circuitry module 106B1, and/or a single voltage source test circuitry module 106B2, the controller circuitry 104 will make available single phase testing capability. Where multiple current source test circuitry modules 106B1, and/or voltage source test circuitry modules 106B2 are inserted, multiple phase testing is made available by the controller circuitry 104.

In the examples illustrated in FIGS. 1-4, the logic I/O test circuitry module 106A may provide four independently programmable test ports 208. The test ports 208 of the I/O test circuitry module 106A may be user configured for use as inputs to monitor external operation of devices used to detect relay operation, and may be configured as outputs for simulating system conditions for testing operative functional of the protective relay(s) under test. For example, the logic I/O test circuitry module 106A may receive and sense inputs from metering devices for calibration and testing purposes and output digital or analog signals to initiate/test functionality of protective relays.

With the diagnostic test system 100 configured by the user to test metering or protective relays, the power source test circuitry modules 106B may provide simulation of voltages and currents representative of line power being metered or monitored by the power systems device 102, such as a meter or protective relay, under test. In example test configurations, the current source test circuitry module 106B1 may operate as a current amplifier to provide a predetermined magnitude of complex power, such as 300 VA. In an example, the current source test circuitry module 106B1 may be configured as two 150 VA sources with a quantity, such as four, of predetermined ranges of amplitude, such as 300 volts when both sources are combined, 150 volts, 75 volts and 37.5 volts. These example ranges may allow a user operating the diagnostic test system 100 to deliver the maximum amount of VA over the specific ranges to be able to test, for example, high burden relays such as legacy electromechanical technology. In addition, the current source test circuitry module 106B1 may be used for testing microprocessor based protective relay technology. In example configurations, the voltage source test circuitry module 106B2 may operate as a voltage amplifier to provide a predetermined output voltage of, for example, 300 VA of power that can be configured into two independent source or paralleled as a single source. The voltage source test circuitry module 106B2 may include different ranges of output voltages in order to provide continuous output, such as 40 amps combined output sources, two 20 amps sources, 10 amp, and 5 amp ranges, and also provide a transient range for temporary higher output ranges, such as 70 amp, 35 amp, and 17.5 amp, and higher VA output capability.

Upon insertion of the test circuitry modules 106A, 106B1 and 106B2 into respective bays 108, the controller circuitry 104 may sense the presence of the test circuitry modules 106A, 106B1 and 106B2 in the respective bays 108. The controller circuitry 104 may then interrogate each of the test circuitry modules 106A, 106B1, 106B2 via the I/O interface 126. Following identification of the type of each of the test circuitry modules 106A, 106B1 and 106B2, as a logic I/O type and a power source type, the controller circuitry may generate in the user interface 122, a graphical representation of logic I/O test circuitry 106A, current source test circuitry module 106B1, and voltage source test circuitry 106B2 according to their respective bay locations in the respective bays 108. In addition or alternatively, the controller circuitry 104 may cause generation of a listing of available testing capabilities on the user interface 122 according to the type of respective test circuitry module 106A, 106B1, 106B2, identified in each of the bays. The test capabilities may be in the form of a list of available tests.

From the user interface 122, a user may select an available testing capability from the list. The controller circuitry 104 may receive a user selection signal, indicative of the available testing capability selected by the user from the list of available testing capabilities. In response to the selection, the controller circuitry 104 may instantiate a firmware set to provide the selected available testing capability. Each of the tests available in the list may have a firmware set available for instantiation in response to selection. Different tests in the list may include all or part of the same executable firmware according to the functionality needed to perform the selected test.

The controller circuitry 104 may output configuration instructions to the respective test circuitry modules 106 in each of the bays 108 according to the available testing capability selected from the list. In addition, the controller circuitry 104 may identify the power source test circuitry modules 106B1 and 106B2 as a power source group 210 according to the type identification of these modules and the respective bay locations of the modules 106B1 and 106B2. Once identified as being in a power source group 210, the power source test circuitry modules 106B1 and 106B2 may be instantiated with the controller circuitry 104 to cooperatively operate to provide voltage and current outputs to test a power system device 102. The controller circuitry 104 may control the power source group 210 of respective test circuitry modules 106 to independently and selectively supply different phases of at least one of voltage and current according to the respective bay location of the respective test circuitry modules 106 in the power source group 210. For example, the power source group 210 illustrated in FIG. 2 may be for single phase testing since only one current source test circuitry module 106B1 and one voltage source test circuitry module 106B2 are present. In another example, the power source group 210 illustrated in FIG. 4 may be for multi-phase testing since two current source test circuitry modules 106B1 and two voltage source test circuitry modules 106B2 are present.

In addition, the controller circuitry 104 may configure at least one of the test circuitry modules 106 identified as a logic I/O type to be associated with the identified power group. The controller circuitry 104 may control at least one of the logic I/O test circuitry modules 106A in a bay 108 to independently and selectively provide logic I/O in coordination with the power source group 210. In this way, a test protocol for a particular power system device 102 may be implemented using the power source group 210 in cooperative operation with at least one of the logic I/O test circuitry modules 106A. In the example diagnostic test system 100 of FIG. 2, two of the logic I/O test circuitry are present and available for configuration in a test protocol to cooperatively operate with the power source group 210. In the example diagnostic system 100 of FIG. 4, three of the logic I/O test circuitry are present and available for configuration in a test protocol to cooperatively operate with the power source group 210.

Cooperative operation of one or more identified logic I/O test circuitry modules 106A with one or more identified power source test circuitry modules 106B may include coordinated operation of the modules 106A and 106B to coordinate simulation of field input signals. In addition, the modules 106A and 106B may share resources, such as memory storage resources or execution processing power resources as part of the coordinated operation. For example, a portion of excessive processing in a first power source test circuitry module 106B may be allocated to a second power source test circuitry module 106B.

As illustrated in the example of FIG. 4, each of the respective test circuitry modules 106 may include respective test ports 208 to provide the selected available testing capability and independently drive a light emitting diode (LED) light ring 402 of each of the respective test ports to illuminate with a predetermined configuration color. The configuration colors may provide a configuration instruction to visually identify an assigned functionality of the respective test ports. Each of the test ports 208 includes a light emitting diode (LED) light ring 402. In examples, the LED light ring 402 may include a transparency ring and a flexible LED ring assembly. The transparency ring, may be a lens providing light dispersion and protection, such as a translucent light ring to protect the flexible LED ring assembly from debris and/or water. Alternatively, the transparency ring may be omitted.

The transparency ring, such as in the form of a translucent light ring, may be designed to optimize reflection of useable light out of the test ports 206 toward the user. The controller circuitry 104 may drive the LED light ring 402 to illuminate with one of a plurality of predetermined colors according to a user selectable configuration of a grouping of the power source type test circuitry modules 106B. Example colors include red, yellow and blue, where red may be used to represent a first phase of a complex power signal, yellow may be used to represent a second phase, and blue may be used to represent a third phase of a complex power system.

Figure 5:
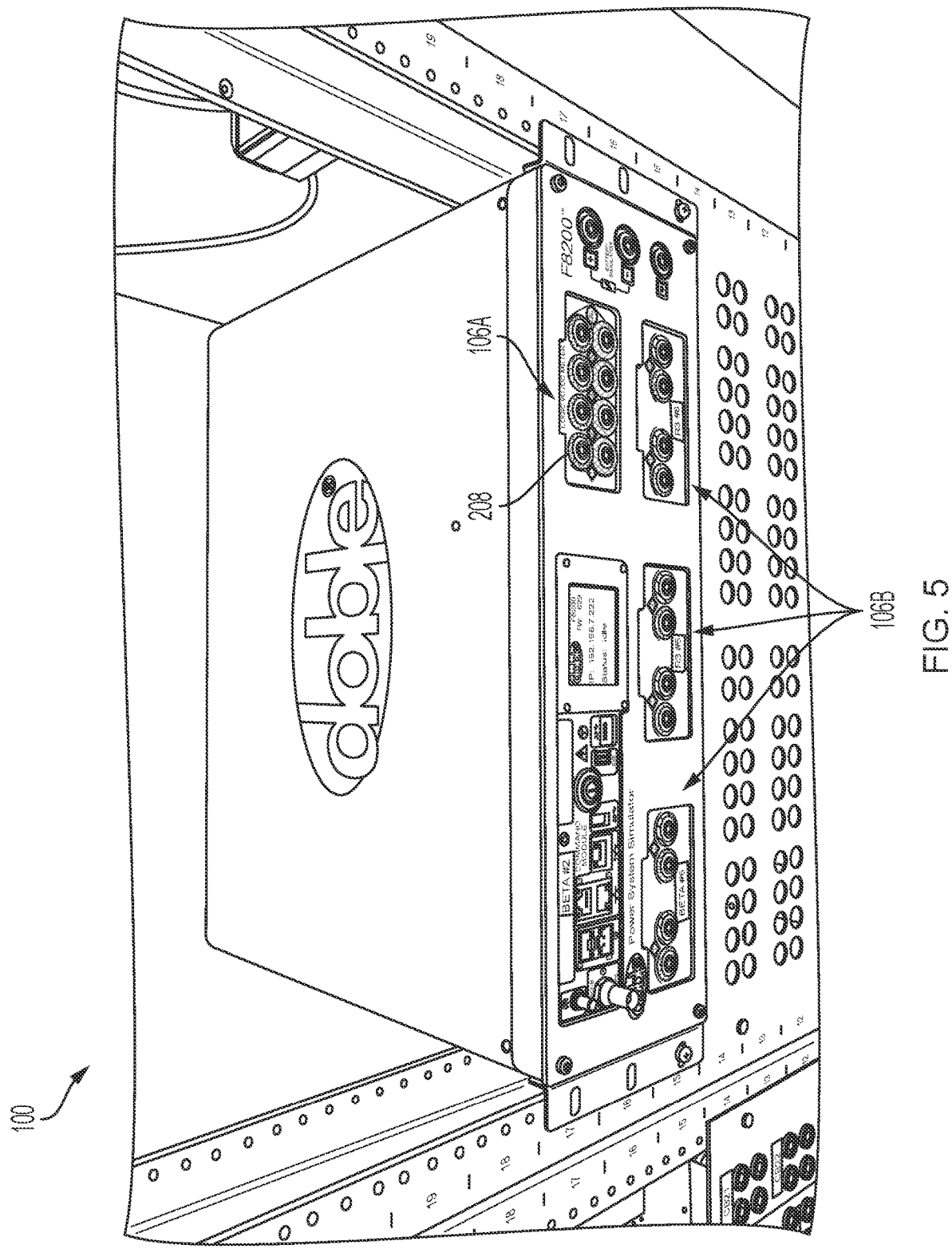
FIG. 5 illustrates an example of a diagnostic test system with test ports illuminated by the LED light rings.

FIG. 5 illustrates an example of a diagnostic test system 100 with the test ports 208 illuminated by the LED light rings 402. In this example, three test circuitry modules 106B1 and/or 106B2 of the power source type, and one test circuitry module 106A of the logic I/O type are illustrated. In the illustrated example, red and green colors are used to identify positive and negative test ports of the power source type capable of outputting current, voltage, or both. In addition, red and blue colors may be used to identify positive and negative connections for signals in the I/O logic type.

The LED light rings 402 may be driven by the controller circuitry 104, the respective test circuitry module 106, or some combination thereof. Color output of the LED light rings 402 may be driven for:

a. Color coding connections of test leads with appropriate test ports 208 on appropriate test circuitry modules 106 during testing setup for a particular diagnostic test. For example, phase A voltage and current test ports 208 configured by the system to be located on one of the power source test circuitry modules 106B may be a different color than phase B voltage and current test ports 208 be located on one of the power source test circuitry modules 106B. Accordingly, illumination of the appropriate test ports 298 with color coding may assist with interconnection.

b. Selectively illuminating test ports 208 in order to provide indication of signal activity in the form of visual confirmation of output or input of voltage/current/signal to respective test ports 208 during the testing procedure. For example, illumination of the test ports 208 may visualize asserted input and output signals.

c. Selectively illuminate test ports 208 with, for example, flashing light for the LED light ring 402 in response to the controller circuitry 104 and/or the test circuitry module 106 detecting a connection error in the connection of test leads to the test ports 208.

Referring to FIGS. 1-5, the diagnostic test system 100 platform allows multiple configurations of different test circuitry modules 106 in the chassis 110. Examples of these multiple configurations may include multiple analog power source connections, such as multiple power source test circuitry modules 106B and multiple sense connections, such as multiple logic I/O test circuitry modules 106A. Using the LED light rings 402 on the test ports 206, the controller circuitry 104 and/or the test circuitry modules 106 may help define the correct connectivity for a given diagnostic test available in diagnostic test system 100 according to the test circuitry modules 106 inserted in the bays 108.

In addition, the controller circuitry 104 and/or the test circuitry modules 106 may sense and indicate errors in connections, hardware failure, dangerous conditions and other operational and use scenarios using the LED light rings 402. By driving the LED light rings with any of a number of different colors, specific indications may be provided to easily identify an issue with system configuration or connection; assist the user in correcting the identified issues, such as a connection issue; and/or provide operation of a sense condition to the controller circuitry 104 and/or the test circuitry modules 106 for application testing. Since the instrument can be configured with different test circuitry modules 106 in any available bay 108, the system 100 may automatically indicate to a user the correct configuration according to the user selected available testing capability, thereby eliminating any confusion regarding random or varied configuration of inserted test circuitry modules 106.

The LED light ring 402 may be driven by the controller circuitry 104 or the power source test circuitry modules 106B to provide color designations for each test port 206 to allow assigning colors to the different voltage and current amplifier outputs for easy recognition of connectivity and output definition for the user. Each LED light ring 402 may provide a spectrum of colors selectable by the user or provided by a selected test protocol. For example, different voltages/current phases may be indicated with different colors. Accordingly, the illuminated colors of the LED light rings 402 may identify and providing clarity of voltage and current phase relationships that are standards in the power industry. For example, Red for A-phase, Yellow for B-phase, and Blue for C-phase applications. The system may also allow user configuration of illumination colors for different assigned functionality of the test ports 206. Thus, for example, in multiple phase applications the user may select various other colors for more than three phase applications.

The LED light rings 402 may be included and dynamically illuminated with any of various colors in any of the test circuitry modules 106 having test ports 206. In addition, the LED light rings 402 may be included and dynamically illuminated in other test ports 206 in the diagnostic test system, such as battery simulator test port 202, the ground test port 204, the controller circuitry 104, or any other test port 206 included in the system 100. the configurations of the modules may vary depending on the frame size (number of bays in the chassis 110) chosen by the end user to accommodate the diverse needs of protection related testing requirements.

The LED light rings 402 may be driven to illuminate in many different sequences and/or patterns for different visual indications to a user. For example, pre-selected LED light rings 402 may flash for errors, remain solidly lit for connection of test leads, indicate when a sensed input is detected, and/or pulsed to indicate an output for an active power source. Examples of errors include visualization of improper test lead connections, visualization of a faulted amplifier where predetermined colors of the LED test rings 402 provide the condition causing the fault and open current detection. The LED light rings 402 may also be used to visualize replay of a pre-recorded sequence of events, such as from a test protocol, or from a field event sensed by the system 100. Further, power quality parameters may be visualized with the LED light rings 402, channel modulation, safety of the unit, such as ground conditions, and visualization of configuration, such as in groups, including remote node configuration, such as equipment under test which is located remotely from the test location.

Also, the diagnostic test system 100 may communicate messages to the user via the LED light rings 402. For example, power-on self-test (POST) progress and results, as well as diagnostic details may be provided through different visualizations with the LED light rings 402. In other examples, other indications are possible, such as variation intensity with amplitude or magnitude of the input/output, sequential illumination as indications of steps in a procedure, color changes to indicate stages in a test protocol. For example, the system may provide visualization of sensed conditions, such as varying selected LED light rings 402 from green to orange to red, visualization of values of variables being input or output from a given test port 206, such as from white at zero or no load, through shades of red to indicate the signal level. In other examples, any other color, sequence, intensity providing a visual indication for a user may be automated or manually configured.

The illumination timing, colors, patterns, and intensity of the LED lights rings 402 may be driven in an automated fashion by the controller circuitry 104 and/or the test circuitry modules 106 as defined by the test protocol of a particular selected available testing capability. Automation of the illumination behavior of the LED light rings 402 in a given test protocol may be programmatically controlled by the test protocol, and/or by a user configuring the given test protocol. In addition, a user may manually control visualization of the LED light rings 402 within a given test protocol to meet the needs of the user during the testing. Alternatively, or in addition, the visualization of the LED light rings 402 may be manually controlled and/or defined by a user outside of any test protocol. In addition, functions may be visually assigned to the test ports 206 of a respective test circuitry module 106 by illumination of the LED light rings 402 with a predetermined color, pattern or sequence.

The system 100 may also be configured with non-color visualizations for those conditions or situations where color is undesirable, such as due to the user being color blind. In the non-color mode, the system 100 may use varying light intensity, predetermined light sequences or other forms of control to provide communication to the user via the test ports 206 of the test circuitry modules 106.

Figure 6:
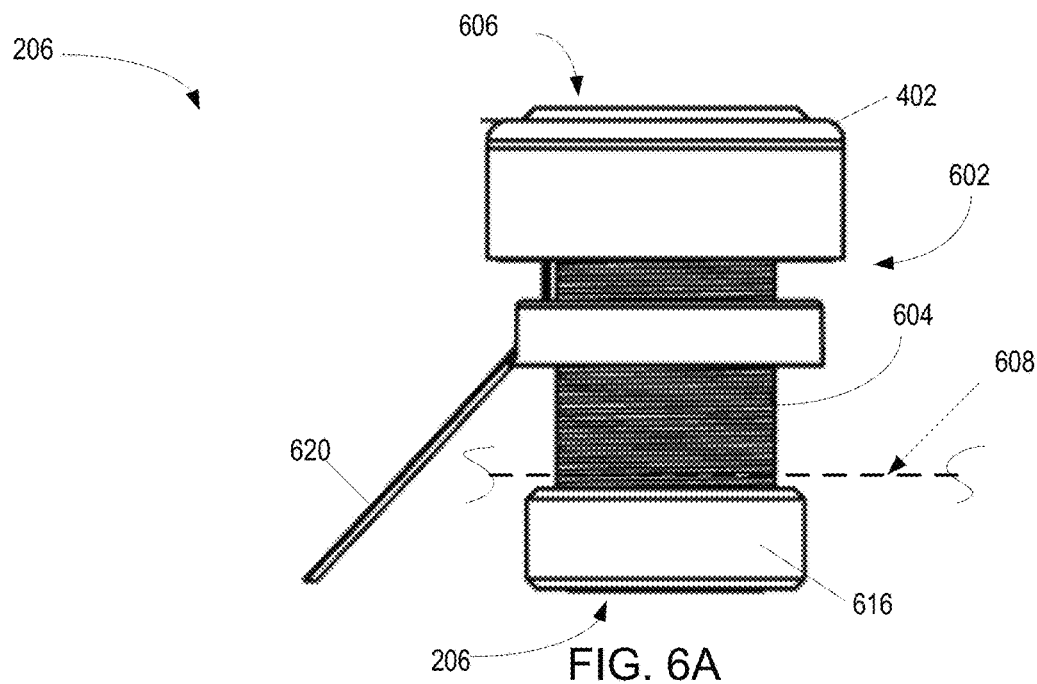
FIG. 6 is an example of a test port consisting of FIGS. 6A, 6B and 6C.
Figure 6:
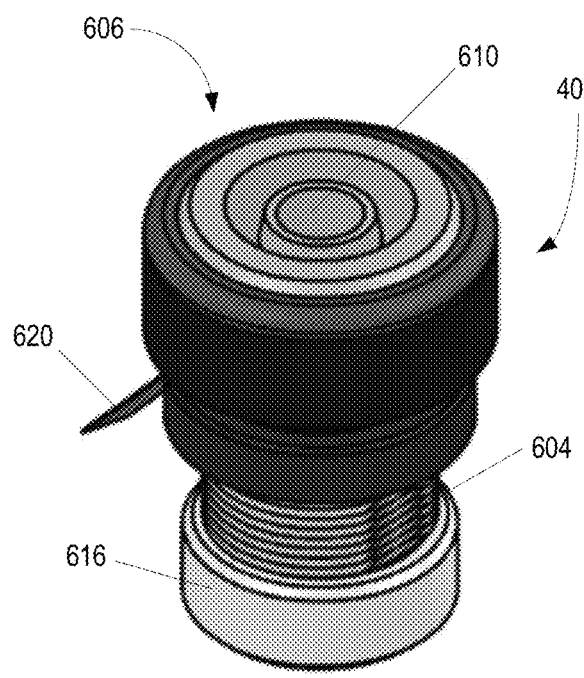
Figure 6:
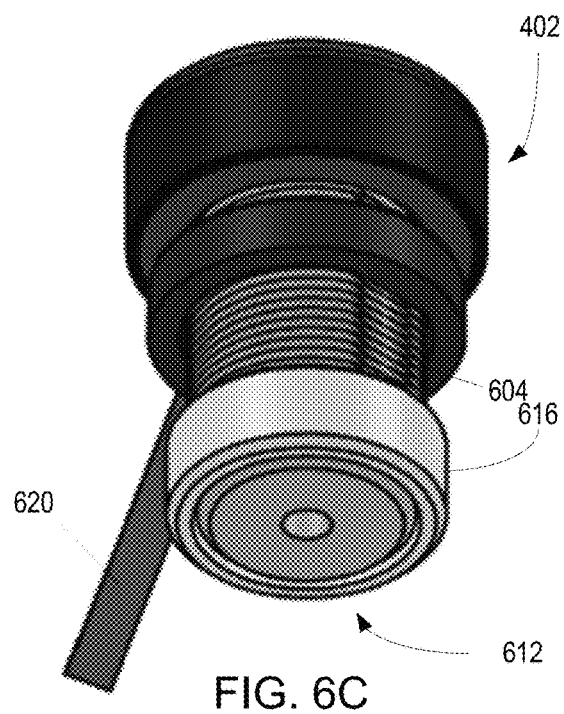

FIG. 6 is an example of a test port 206. FIG. 6A is front view, and FIGS. 6B and 6C are perspective views of the test port 206 not installed in the chassis 110. The test port 206 includes a body 602 having a threaded shaft 604. A proximate end 606 of the body 602 extends from a flat panel 608 in which the test port 206 is installed, such as a front face of a test circuitry module 106. The proximate end 606 includes a connection 610 for a test lead. In the illustrated example, the connection 610 is an aperture configured to receive a male plug, such as 4 mm or 2 mm banana plugs used to connect test leads or monitor the output of power sources or status of sensed conditions of logic I/O, such as voltages (analog) or dry contact (digital) conditions. In other examples, other forms of detachable plugs may be used to form an electrical connection with a test lead. A distal end 612 of the body extends through the panel 608 such that a thread fastener 616 may be rotably coupled with the threaded shaft 604 and compressively and rigidly hold the test port 206 in the panel 608.

The LED light ring 402 may be proximate the proximate end 606 and circumferentially surrounding the connector 610 and a portion of the threaded shaft 604. The LED light ring 402 may include a signal coupling line 620. The signal coupling line 620 may be coupled with an LED driver circuit (not shown) that is controlled by one of the controller circuitry 104 or one or more of the test circuitry modules 106. The coupling line 620 may be, for example, a flexible printed circuit board (PCB). In other examples, other forms of signal line are possible.

Figure 7:
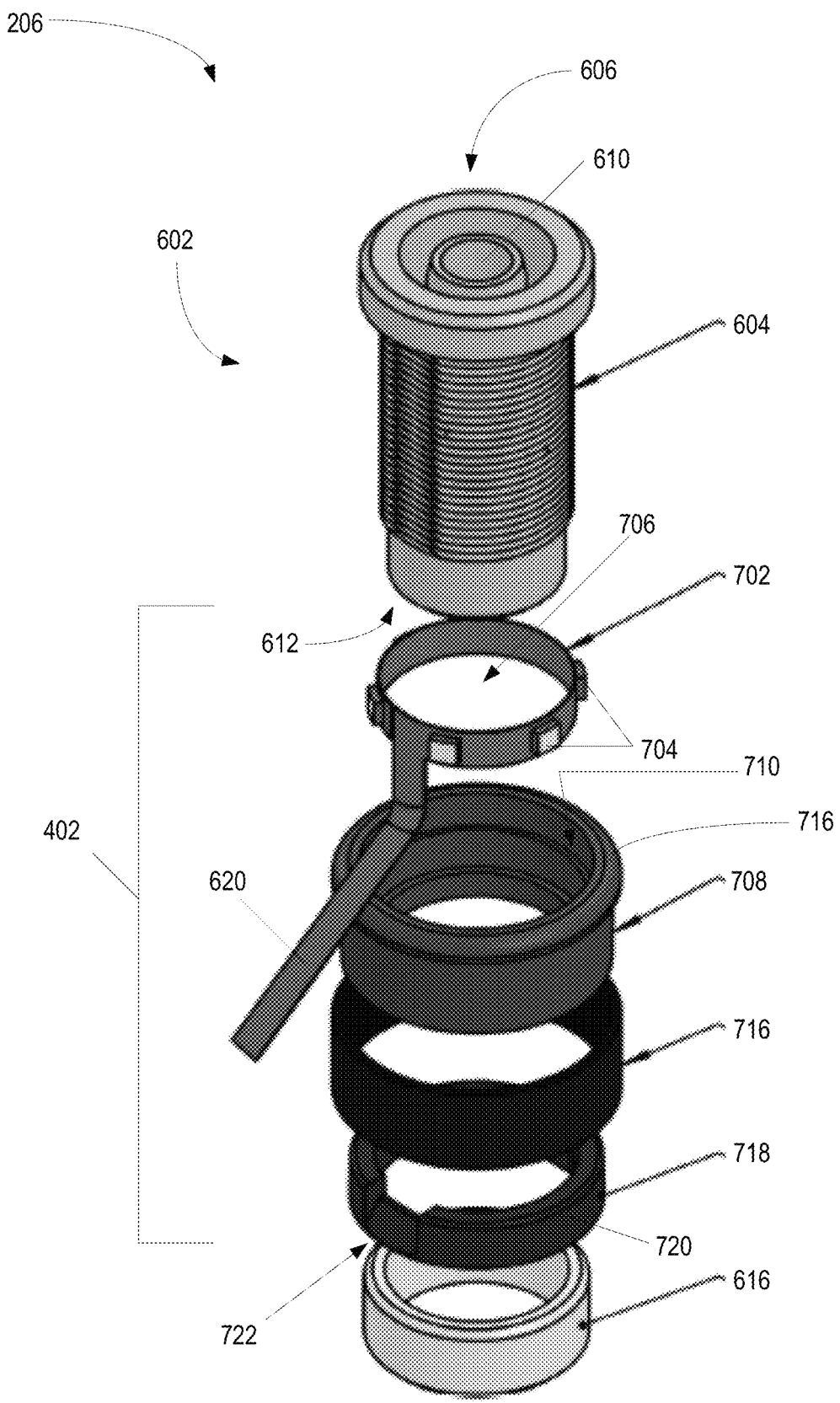
FIG. 7 is an exploded view of an example test port.

FIG. 7 is an exploded view of an example test port 206. The test port 206 includes the LED light ring 402. The LED light ring 402 includes a flexible LED ring assembly 702, and the coupling line 620 is electrically coupled with a plurality of LEDs 704 included in the flexible LED ring assembly 702. In an example, the flexible LED ring assembly 702 is a flexible PCB with LEDs 704 mounted thereon, and the coupling line 620 is included as part of the flexible PCB. The flexible LED ring assembly may be a circular structure of a predetermined diameter with a central aperture 706 sized to receive the threaded shaft 604 portion of the body 602.

The LED light ring 402 also includes a transparency ring 708 having a central aperture 710 sized to receive and surround the body 602, and a sleeve 714 surrounding a portion of the transparency ring. The transparency ring 708 may include a shelf 712 formed in an interior wall surface of the transparency ring 708. The shelf 712 may be sized and positioned in the transparency ring 708 to receive the flexible LED ring assembly 702 such that the flexible LED ring assembly 702 is positioned between the threaded shaft 604 and the transparency ring 708, with the LEDs 704 in the LED ring assembly 702 facing radially outward toward the transparency ring 708.

The transparency ring 708 may be formed of a translucent material, such as plastic, which includes a reflective material additive. In an example, the additive may be a reflective powder that is added to the plastic prior to forming the transparency ring 708. In this example, the additive material may be 15% of the material forming the transparency ring 708. In another example, the additive material may be other reflective material and may be in other ranges capable of providing visually perceptible illumination under varying conditions, such as in bright sunlight and/or in darkness. The transparency ring 708, may operate as a lens or waveguide providing light dispersion and physical protection of the flexible light ring assembly, such as a translucent light ring to protect the flexible LED ring assembly 702 from debris and/or water.

The sleeve 714 may be disposed radially outside the transparency ring 708, and may extend up to a lip 716 of the transparency ring 708 near the proximate end of the body 602, and surrounding the connector 610. Due to the sleeve 714 and the reflective material additive, light energy emitted by the LEDs 704 may be communicated and focused toward the lip 716. The lip 716 may be positioned on a panel surrounding the connector 610 to identify the connector 610 with light energy of various colors emitted from the lip 718. Accordingly, even in very bright environmental conditions, such as bright midday sun, the color changes of the test ports 206 are visible to a user.

The LED light ring 402 also includes a keeper ring 718. The keeper ring 718 may have a central aperture to receive the threaded shaft 604, and a surrounding wall 720 sized to be received in the central aperture formed within central area of the transparency ring 708. The keep ring 718 may be held in the central aperture by friction fit snap-fit, or some other mechanical device or system used between the outer wall of the keeper ring 718 and the inner wall of the transparency ring 708. The keeper ring 718 may also include a trough 722. The trough 722 may be sized and positioned to receive the coupling line 620. Accordingly, the coupling line 620 may extend away from the test port 206 through the trough 722.

Using the illuminated light rings, the user may be provided with clear connection instructions off test leads to amplifiers and logic input/outputs for protection testing purposes. In addition, selective illumination with predetermined colors in an automated fashion may dynamically indicate errors or dangerous conditions that could cause equipment or bodily harm. Also, illumination of the LED light rings with predetermined colors may indicate an active source that may not be evident when performing test.

Figure 8:
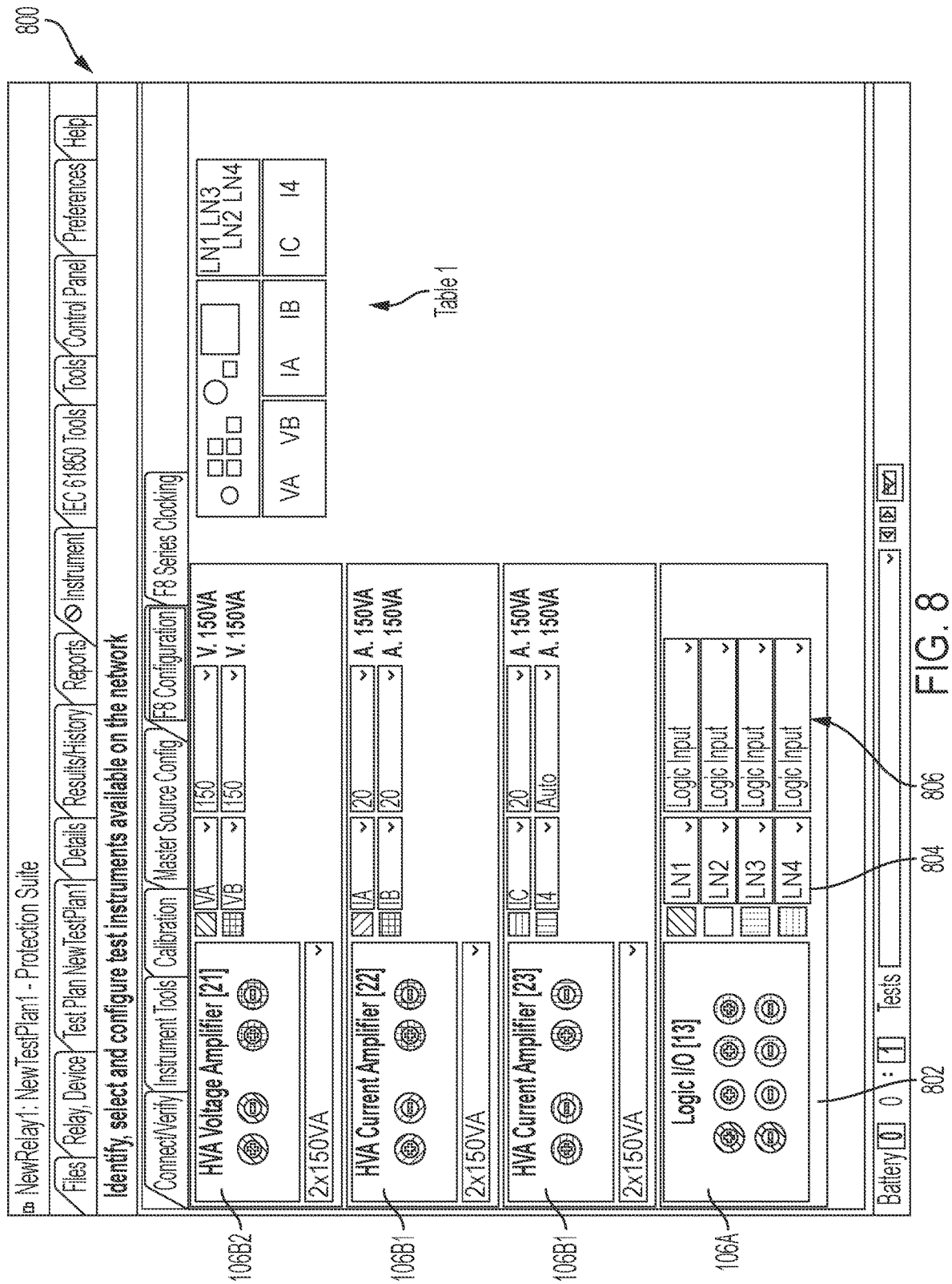
FIG. 8 is an example configuration screen of the diagnostic test system

FIG. 8 is an example configuration screen 800 of the diagnostic test system 100. The configuration screen 800 may be displayed in the user interface 122 and/or in an external device, such as a portable computing device in communication with the diagnostic test system 100. The configuration screen 800 may be populated following discovery of the test circuitry modules 106 inserted in the bays 108. In the example of FIG. 8, the user configured positioning of the test circuitry modules 106 may align with Table 1 herein when the controller circuitry 104 identifies voltage source test circuitry module 106B2 in a first bay, current source test circuitry modules 106B1 in a second bay and a third bay, respectively, and a logic I/O test circuitry 106A in a fourth bay in the chassis 110.

The test ports 206 and the corresponding test port colors, are graphically displayed in a connection diagram 802 next to a color logic selection 804. The color logic section 804 may allow a user to choose/customize the illumination colors of the respective test ports 206 during testing, alarming, and/or setup. Alternatively, the user may allow use of the default colors.

A description of the test circuitry module output is also provided in an output column 806. In addition, for those modules in the source group, the available output power of the respective power source test circuitry 106B is provided in a source power column 806. Also, a graphical illustration of the positioning of the test circuitry modules 106 in the bays 108 may be displayed in the example configuration screen.

Figure 9:
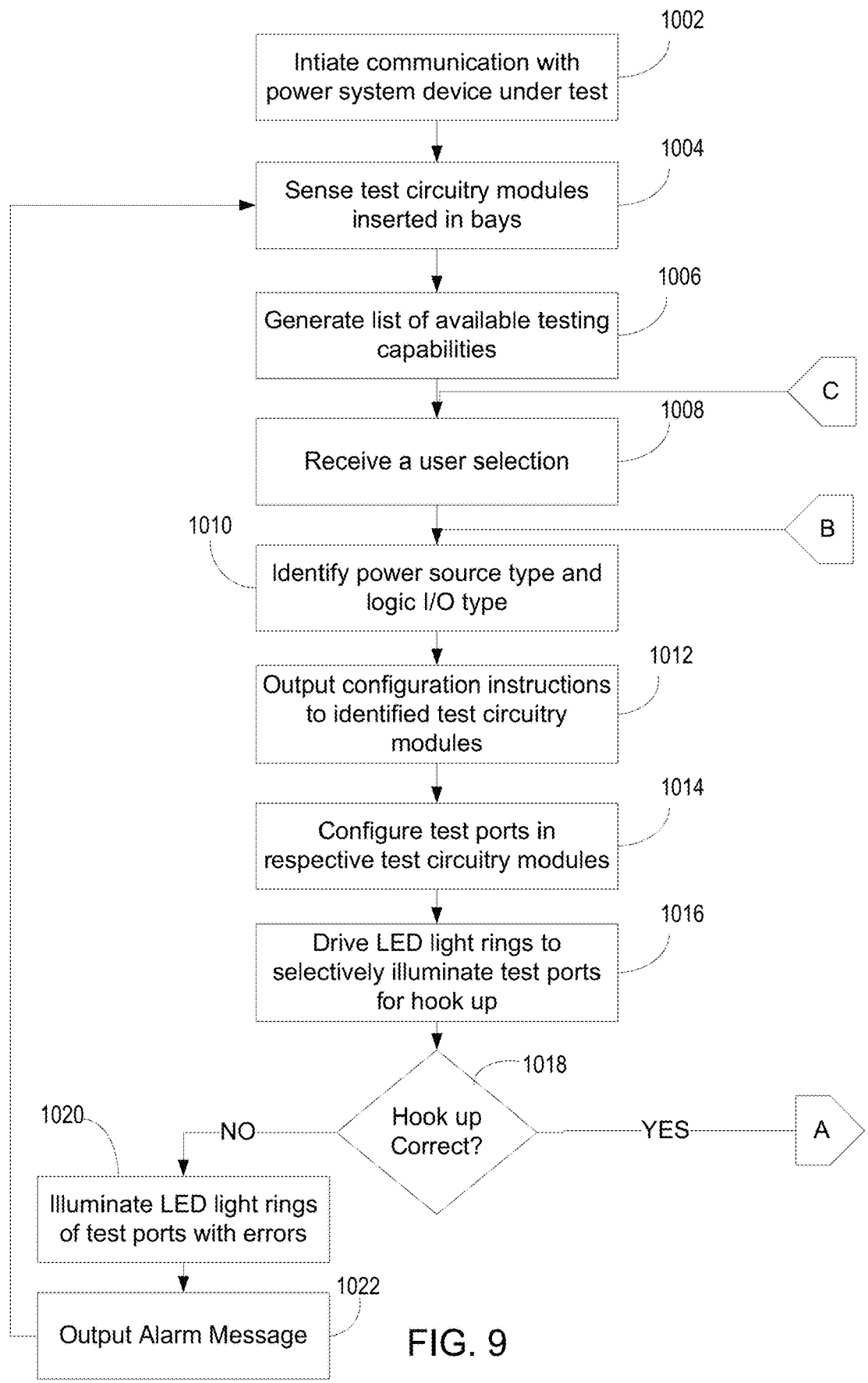
FIG. 9 is an operational flow diagram depicting example operation of the diagnostic test system.

FIG. 9 is an operational flow diagram depicting example operation of the diagnostic test system 100. Referring to FIGS. 1-9, the operation commences with initiating communication between the diagnostic test system 100 and the power system device 102 under test using the communication interface 128. (1002) The controller circuitry 104 may sense in each of the bays 108 whether a respective test circuitry module 106 is inserted therein. (1004) The controller circuitry 104 may interrogate respective test circuitry modules 106 in each respective bay sensed as having a test circuitry module inserted to identify a type of the respective test circuitry module. A list of available test capabilities may be generated in the user interface 122 by the controller circuitry 104 driving a display. (1006) The listing of available testing capabilities may be displayed according to the type of each of the respective test circuitry modules identified in respective bays in the chassis.

The controller circuitry 104 may receive a user selection signal indicative of a selected available testing capability from the list of available testing capabilities displayed in the user interface 122. (1008) In accordance with the selected testing capability, a plurality of the test circuitry modules 106 may be grouped by the controller circuitry 104 as a power source group 210 according to the configuration instructions and the bay 108 in which the respective test circuitry module 106 is inserted. The type of each test circuitry module 106 in the group may be identified as a power source type. In addition, logic I/O type of test circuitry modules 106 may be identified. (1010) The controller circuitry 104 may output configuration instructions to respective test circuitry modules 106 in each of the bays 108 according to the selected available testing capability. (1012)

Test ports 206 included in each of the respective test circuitry modules 106 may be configured by the respective test circuitry modules 106 to provide the selected available testing capability. (1014) In addition, LED light rings 402 included with respective test ports 206 may be selectively illuminated with a respective predetermined configuration color as a configuration instruction to visually identify an assigned functionality of the respective test ports 206. (1016) The assigned functionality and therefore the illumination may indicate to a user how to electrically connect test leads to the system 100.

The controller circuitry 104 and/or the test circuitry modules 106 may determine if the test leads are properly connected. (1018) The controller circuitry 104 and/or the test circuitry modules 106 may monitor the test ports in the respective test circuitry modules for an unexpected signal, current, or voltage. In response to detection of an unexpected signal, current, or voltage in one or more of the test ports 206, the controller circuitry 104 and/or the test circuitry modules 106 may drive the LED light ring 402 to change the illumination of the LED light ring 402 to an alarm color. (1020) In addition, the controller circuitry 104 may output a corresponding alarm message in the user interface 122 (1022), and the operation may return to sensing test circuitry modules 106. (1004)

Figure 10:
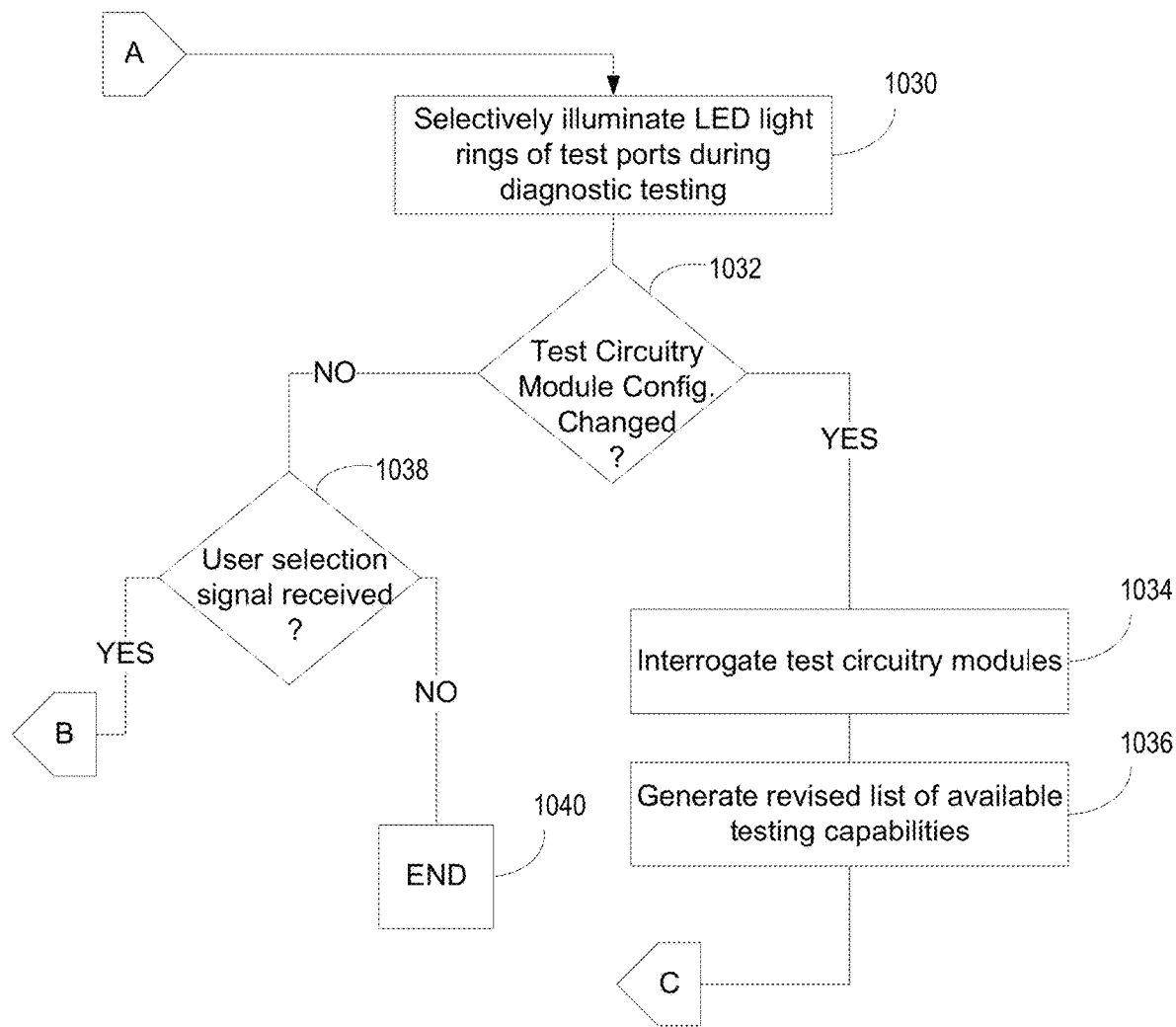
FIG. 10 is an operational flow diagram depicting example operation of the diagnostic test system.

Referring to FIG. 10, if the test leads are not sensed as being incorrected terminated, the controller circuitry 104 and/or the test circuitry modules 106 may selectively illuminate the LED light rings 402 associated with respective test ports 206 during diagnostic testing with a test protocol. (1030) The controller circuitry 104 may sense initiation of a selected available testing capability from the user interface 122. The controller circuitry may drive the LED light rings 402 to extinguish the predetermined configuration color and then drive the LED light rings 402 to selectively illuminate with a predetermined test color according to outputs of respective test ports during a test protocol of the selected available testing capability.

The controller circuitry 104 may sense that respective test circuitry modules 106 in at least some of the bays 108 have been interchanged with other test circuitry modules 108. (1032) The controller circuitry 104 may interrogate the other test circuitry modules 106 inserted in respective bays 108 to identify the type of the other test circuitry modules that were inserted. (1034) The controller circuitry 104 may generate a revised listing of available testing capabilities according to the type of the other test circuitry modules identified in each of the bays (1036), and the operation may return to receiving a user selection of an available test capability. (1008) If there is no change in the test circuitry modules 106 locations in the bays 108, the controller circuitry may monitor for a user selection of another available test capability. (1038) If no additional user selection is received for a predetermined period of time, the operation will end. (1040) If the controller circuitry 104 senses a signal indicative of another selected available testing capability from the list of available testing capabilities in the user interface, the controller circuitry 104 may initiate reconfiguration of at least some of the test circuitry modules 106 by the operation returning identifying the power source type and the logic I/O type of test circuitry modules 106. (1010) Due to the newly selected testing capability, the plurality of respective test ports 206 of at least some of the respective test circuitry modules 106 may be re-configuring to provide the newly selected available testing capability by outputting configuration instructions. Accordingly, the controller circuitry 104 may independently drive the LED light ring 402 of each of the respective test ports 206 to illuminate with another predetermined configuration color as a configuration instruction to visually identify a different assigned functionality of the respective test ports.

The methods, devices, processing, circuitry, and logic described above may be implemented in many different ways and in many different combinations of hardware and software. For example, all or parts of the implementations may be circuitry that includes an instruction processor, such as a Central Processing Unit (CPU), microcontroller, or a microprocessor; or as an Application Specific Integrated Circuit (ASIC), Programmable Logic Device (PLD), or Field Programmable Gate Array (FPGA); or as circuitry that includes discrete logic or other circuit components, including analog circuit components, digital circuit components or both; or any combination thereof. The circuitry may include discrete interconnected hardware components or may be combined on a single integrated circuit die, distributed among multiple integrated circuit dies, or implemented in a Multiple Chip Module (MCM) of multiple integrated circuit dies in a common package, as examples.

Accordingly, the circuitry may store or access instructions for execution, or may implement its functionality in hardware alone. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed. For instance, the circuitry may include multiple distinct system components, such as multiple processors and memories, and may span multiple distributed processing systems. Parameters, databases, and other data structures may be separately stored and managed, may be incorporated into a single memory or database, may be logically and physically organized in many different ways, and may be implemented in many different ways. Example implementations include linked lists, program variables, hash tables, arrays, records (e.g., database records), objects, and implicit storage mechanisms. Instructions may form parts (e.g., subroutines or other code sections) of a single program, may form multiple separate programs, may be distributed across multiple memories and processors, and may be implemented in many different ways. Example implementations include stand-alone programs, and as part of a library, such as a shared library like a Dynamic Link Library (DLL). The library, for example, may contain shared data and one or more shared programs that include instructions that perform any of the processing described above or illustrated in the drawings, when executed by the circuitry.

In some examples, each unit, subunit, and/or module of the system may include a logical component. Each logical component may be hardware or a combination of hardware and software. For example, each logical component may include an application specific integrated circuit (ASIC), a Field Programmable Gate Array (FPGA), a digital logic circuit, an analog circuit, a combination of discrete circuits, gates, or any other type of hardware or combination thereof. Alternatively or in addition, each logical component may include memory hardware, such as a portion of the memory, for example, that comprises instructions executable with the processor or other processors to implement one or more of the features of the logical components. When any one of the logical components includes the portion of the memory that comprises instructions executable with the processor, the logical component may or may not include the processor. In some examples, each logical components may just be the portion of the memory or other physical memory that comprises instructions executable with the processor or other processor to implement the features of the corresponding logical component without the logical component including any other hardware. Because each logical component includes at least some hardware even when the included hardware comprises software, each logical component may be interchangeably referred to as a hardware logical component.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A diagnostic test instrument comprising:
a controller circuitry;
a power supply;
a chassis comprising a plurality of bays;
a plurality of test circuitry modules, each of the test circuitry modules configured to provide a respective test routine to test power equipment external to the diagnostic test instrument and electrically coupled with the diagnostic test instrument, each of the test circuitry modules configured to be interchangeably received in any one of the plurality of bays;
wherein each of the bays includes an input/output (I/O) interface to the controller circuitry and a bus providing an electrical interface with the power supply; and
wherein the controller circuitry is configured to interrogate the test circuitry modules present in the bays and graphically present the respective test routine of the identified test circuitry modules in a user interface according to a respective bay location.

2. The diagnostic test instrument of claim 1, wherein each of the test circuitry modules comprises a plurality of test ports, each of the test ports including a light emitting diode (LED) light ring, the controller circuitry configured to drive the LED light ring to illuminate with one of a plurality of predetermined colors according to a user selectable configuration of a grouping of the test circuitry modules.

3. The diagnostic test instrument of claim 2, wherein the LED light ring circumferentially surrounds a connector included in the test ports and includes a flexible LED ring assembly disposed within a transparency ring, the transparency ring being a translucent ring configured with a predetermined reflectivity to transmit light emitted by the flexible LED ring assembly.

4. The diagnostic test instrument of claim 1, wherein each of the test circuitry modules comprises a housing containing a test circuitry and having a mounting bracket, an I/O connector and an electrical connector mounted on the housing, the mounting bracket configured to engage with the chassis, the I/O connector configured to engage with the I/O interface and the electrical connector configured to engage with the bus in the bays to provide an electrical connection.

5. A diagnostic test instrument comprising:
a controller circuitry;
a power supply;
a chassis comprising a plurality of bays;
a plurality of test circuitry modules, each of the test circuitry modules configured to be interchangeably received in any one of the plurality of bays;
wherein each of the bays includes an input/output (I/O) interface to the controller circuitry and a bus providing an electrical interface with the power supply; and
wherein the controller circuitry is configured to interrogate the test circuitry modules present in the bays and graphically present the identified test circuitry modules in a user interface according to a respective bay location, and wherein the controller circuitry is configured to control a power source group of respective test circuitry modules to independently and selectively supply different phases of at least one of voltage and current according to the respective bay location of the respective test circuitry modules in the power source group.

6. The diagnostic test instrument of claim 5, wherein the controller circuitry is configured to control at least one of the respective test circuitry modules to independently and selectively provide logic I/O in coordination with the power source group.

7. A diagnostic test instrument comprising:
a controller circuitry;
a power supply;
a chassis comprising a plurality of bays;
a plurality of test circuitry modules, each of the test circuitry modules configured to be interchangeably received in any one of the plurality of bays;
wherein each of the test circuitry modules comprises a voltage amplifier and a current amplifier included in an enclosure, and the controller circuitry is configured to control the test circuitry modules to independently and selectively supply at least one of voltage and current in a predetermined phase according to a bay location of the respective test circuitry modules and a test protocol being executed by the controller circuitry;
wherein each of the bays includes an input/output (I/O) interface to the controller circuitry and a bus providing an electrical interface with the power supply; and
wherein the controller circuitry is configured to interrogate the test circuitry modules present in the bays and graphically present the identified test circuitry modules in a user interface according to a respective bay location.

8. A method of testing with a diagnostic test instrument comprising:
sensing, with a controller circuitry, whether each of a plurality of bays including in a chassis have a respective test circuitry module inserted therein;
interrogating, with the controller circuitry, the respective test circuitry module inserted in each respective bay to identify a type of the respective test circuitry module;
generating a listing of available testing capabilities on a user interface according to the type of the respective test circuitry module identified in each of the bays;
receiving a user selection signal, the user selection signal indicative of a selected available testing capability from the list of available testing capabilities in the user interface;
outputting configuration instructions to respective test circuitry modules in each of the bays according to the selected available testing capability; and
each of the respective test circuitry modules: configuring a plurality of respective test ports to provide the selected available testing capability and independently driving a light emitting diode (LED) light ring of each of the respective test ports to illuminate with a predetermined configuration color as a configuration instruction to visually identify an assigned functionality of the respective test ports.

9. The method of claim 8, wherein generating a listing of available testing capabilities comprises displaying a list of available tests on a display screen included in the diagnostic test instrument.

10. The method of claim 8, outputting configuration instructions to respective test circuitry modules in each of the bays comprises grouping a plurality of the test circuitry modules as power source group according to the configuration instructions and the bay in which the respective test circuitry module is inserted, a type of each test circuitry module in the group being identified as a power source type.

11. The method of claim 10, outputting configuration instructions to respective test circuitry modules in each of the bays comprises configuring at least one of the respective test circuitry modules as a logic I/O test circuitry associated with the group according the bay in which the respective test circuitry module is inserted, the type of the at least one of the respective test circuitry modules being identified as a logic I/O type.

12. The method of claim 8, further comprising sensing, with the controller circuitry that respective test circuitry modules in at least some of the bays have been interchanged with other test circuitry modules, interrogating, by the controller circuitry, the other test circuitry modules inserted in respective bays to identify the type of the other test circuitry modules; and generating a revised listing of available testing capabilities according to the type of the other test circuitry modules identified in each of the bays.

13. The method of claim 8, further comprising monitoring, the test ports in the respective test circuitry modules, by the controller circuitry for an unexpected signal, current, or voltage; and, responsive to detection of an unexpected signal, current, or voltage in one or more of the test ports, driving the LED light ring to change an illumination of the light ring to an alarm color, and outputting a corresponding alarm message in the user interface.

14. The method of claim 8, further comprising receiving another user selection signal, the another user selection signal indicative of another selected available testing capability from the list of available testing capabilities in the user interface; and, with at least some of the respective test circuitry modules: re-configuring the plurality of respective test ports to provide the another selected available testing capability and independently driving the LED light ring of each of the respective test ports to illuminate with another predetermined configuration color as the configuration instruction to visually identify a different assigned functionality of the respective test ports.

15. The method of claim 8, further comprising sensing, with the control circuitry, initiation of the selected available testing capability; driving the LED light rings to extinguish the predetermined configuration color and then driving the LED light rings to selectively illuminate with a predetermined test color according to outputs of respective test ports during a test protocol of the selected available testing capability.

16. The method of claim 8, wherein outputting configuration instructions to respective test circuitry modules in each of the bays according to the selected available testing capability further comprises instantiating, with the controller circuitry, a firmware set executable to provide the selected available testing capability, the firmware set selected for instantiation from among a plurality of different firmware sets executable to provide other respective available testing capabilities included in the listing of available testing capabilities.

17. A diagnostic test instrument comprising:
a chassis having a plurality of bays;
controller circuitry included in the chassis, the controller circuitry configured to sense in each of the bays whether a respective test circuitry module is inserted therein;
the controller circuitry configured to interrogate respective test circuitry modules in each respective bay sensed as having a test circuitry module inserted to identify a type of the respective test circuitry module;
a user interface driven by the controller circuitry to display a listing of available testing capabilities according to the type of each of the respective test circuitry modules identified in respective bays in the chassis;
the controller circuitry configured to receive a user selection signal indicative of a selected available testing capability from the list of available testing capabilities displayed in the user interface;
the controller circuitry configured to output configuration instructions to respective test circuitry modules in each of the bays according to the selected available testing capability; and
a plurality of respective test ports included in each of the respective test circuitry modules, the test ports configured by the respective test circuitry modules to provide the selected available testing capability and selectively illuminate the test ports with a respective predetermined configuration color as a configuration instruction to visually identify an assigned functionality of the respective test ports.

18. The diagnostic test system of claim 17, wherein the controller circuitry is further configured to provide visualization of messages to the user via selective illumination of the test ports with different colors, different illumination sequences, or both different colors and different illumination sequences.

19. The diagnostic test system of claim 17, wherein the controller circuitry is configured to receive user commands to manually control selective illumination of the test ports with different colors, different illumination sequences, or both different colors and different illumination sequences.

20. The diagnostic test system of claim 17, wherein the controller circuitry is configured to selectively illuminate the test ports with a respective predetermined configuration color as a visual message to a user, the visual message comprising a diagnostic message or an error message or a parameter status message or combinations thereof.

* * * * *